US010591369B2

(12) United States Patent
Neuschaefer-Rube

(10) Patent No.: US 10,591,369 B2
(45) Date of Patent: *Mar. 17, 2020

(54) METHOD AND ARRANGEMENT FOR MEASURING A FORCE OR A MOMENT, USING MULTIPLE MAGNETIC SENSORS

(71) Applicant: SCHAEFFLER TECHNOLOGIES AG & CO. KG, Herzogenaurach (DE)

(72) Inventor: Stephan Neuschaefer-Rube, Herzogenaurach (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/057,133

(22) Filed: Aug. 7, 2018

(65) Prior Publication Data
US 2018/0340851 A1 Nov. 29, 2018

Related U.S. Application Data

(63) Continuation of application No. 15/509,365, filed as application No. PCT/DE2015/200455 on Sep. 9, 2015, now Pat. No. 10,067,017.

(30) Foreign Application Priority Data

Sep. 24, 2014 (DE) .................. 10 2014 219 336

(51) Int. Cl.
*G01L 3/00* (2006.01)
*G01L 3/10* (2006.01)
(Continued)

(52) U.S. Cl.
CPC ............... *G01L 3/102* (2013.01); *G01B 7/20* (2013.01); *G01L 1/125* (2013.01); *G01L 5/16* (2013.01);
(Continued)

(58) Field of Classification Search
CPC . G01L 3/102; G01L 1/125; G01L 5/16; G01L 7/20; H05K 1/0283; H05K 1/189;
(Continued)

(56) References Cited

U.S. PATENT DOCUMENTS 4,750,371 A 6/1988 Kobayashi
4,986,137 A 1/1991 Sato et al.
(Continued)

FOREIGN PATENT DOCUMENTS

CN 1795338 A 6/2006
DE 3940220 6/1990
(Continued)

*Primary Examiner* — Max H Noori
(74) *Attorney, Agent, or Firm* — Volpe and Koenig, P.C.

(57) ABSTRACT

The present invention relates to a method and an arrangement for measuring a force and/or moment on a machine element extending along an axis, using the inverse magnetostrictive effect. The machine element has a magnetization region for magnetization, this region fully encompassing the axis. The arrangement includes at least one first magnetic sensor and one second magnetic sensor, each being designed to measure individually a first and a second direction component of a magnetic field that is caused by the magnetization and by the force and/or the moment. The direction components that can be measured using the first magnetic sensor have differing orientations. Likewise, the direction components that can be measured using the second magnetic sensor have differing orientations. The first magnetic sensor and the second magnetic sensor are arranged around the axis at different peripheral positions.

10 Claims, 8 Drawing Sheets

(51) Int. Cl.
*G01B 7/16* (2006.01)
*H05K 1/02* (2006.01)
*H05K 1/11* (2006.01)
*H05K 1/18* (2006.01)
*G01L 1/12* (2006.01)
*G01L 5/16* (2020.01)

(52) U.S. Cl.
CPC ........... *H05K 1/0283* (2013.01); *H05K 1/111* (2013.01); *H05K 1/189* (2013.01)

(58) Field of Classification Search
CPC ........ H05K 1/111; H05K 1/181; H05K 3/284; H05K 2201/0133; H05K 2201/09281; H05K 2201/09736; H05K 2201/10151; H05K 2201/10439; H05K 2201/2009; H05K 2203/1316; H05K 2203/1322; G01B 7/20
USPC ....................................................... 73/862.06
See application file for complete search history.

(56) References Cited

U.S. PATENT DOCUMENTS

| | | | |
|---|---|---|---|
| 5,052,232 A | 10/1991 | Garshelis | |
| 5,298,689 A | 3/1994 | Mohri et al. | |
| 5,321,985 A | 6/1994 | Kashiwagi et al. | |
| 5,501,110 A | 3/1996 | Peilloud et al. | |
| 5,589,645 A | 12/1996 | Kobayashi | |
| 6,047,605 A | 4/2000 | Garshelis | |
| 6,490,934 B2 | 12/2002 | Garshelis | |
| 6,581,480 B1 | 6/2003 | May et al. | |
| 6,776,057 B1 | 8/2004 | May | |
| 6,810,754 B2 | 11/2004 | May | |
| 7,140,258 B2 | 11/2006 | May | |
| 7,143,656 B2 | 12/2006 | Wan et al. | |
| 7,752,923 B2 | 7/2010 | Shimizu | |
| 8,087,304 B2 | 1/2012 | Lee | |
| 8,191,431 B2 | 6/2012 | Hedayat et al. | |
| 2005/0193834 A1 | 9/2005 | May | |
| 2006/0225521 A1 | 10/2006 | Von Beck | |
| 2007/0022809 A1 | 2/2007 | Yoshida et al. | |
| 2007/0062312 A1 | 3/2007 | Cripe | |
| 2007/0157741 A1 | 7/2007 | Yoshikuwa | |
| 2010/0116066 A1 | 5/2010 | Mizuno | |
| 2012/0103111 A1 | 5/2012 | Baller | |
| 2012/0296577 A1 | 11/2012 | Garshelis et al. | |
| 2013/0147467 A1* | 6/2013 | Engel | G01B 7/012 324/207.12 |
| 2013/0291657 A1 | 11/2013 | Purekar | |
| 2014/0111192 A1* | 4/2014 | Kubik | G01R 33/0017 324/207.21 |
| 2016/0146679 A1* | 5/2016 | Neuschaefer-Rube | G01L 1/122 73/862.041 |
| 2018/0087888 A1* | 3/2018 | Ausserlechner | G01B 7/30 |

FOREIGN PATENT DOCUMENTS

| | | |
|---|---|---|
| DE | 69222588 | 10/1997 |
| DE | 69132101 | 4/2000 |
| DE | 60007641 | 11/2004 |
| DE | 60105794 | 2/2006 |
| DE | 60309678 | 9/2007 |
| DE | 69936138 | 2/2008 |
| DE | 69838904 | 1/2009 |
| EP | 0576310 A1 | 12/1993 |
| EP | 2584331 | 4/2013 |
| EP | 2607873 | 6/2013 |
| JP | H08271355 | 10/1996 |
| WO | 0127638 | 4/2001 |
| WO | 2006053244 | 5/2006 |
| WO | 2007048143 | 4/2007 |

* cited by examiner

METHOD AND ARRANGEMENT FOR MEASURING A FORCE OR A MOMENT, USING MULTIPLE MAGNETIC SENSORS

INCORPORATION BY REFERENCE

The following documents are incorporated by reference as if fully set forth herein: U.S. patent application Ser. No. 15/509,365, filed on Mar. 7, 2017.

BACKGROUND

The present invention relates first to an arrangement for measuring a force and/or a moment on a machine element extending along an axis with at least two magnetic field sensors using the inverse magnetostrictive effect. The invention also relates to a method for measuring a force and/or a moment, wherein the force or the moment acts on a machine element extending along an axis.

U.S. Pat. No. 8,087,304 B2 discloses a magnetoelastic torque sensor for measuring a torque acting on a shaft. The shaft has circumferential magnetization areas.

From US 2012/0296577 A1, a magnetoelastic force sensor is known that is formed for measuring forces on an element that is magnetized circumferentially.

U.S. Pat. No. 5,321,985 teaches a magnetostrictive torque sensor in which a magnetostrictive layer is deposited on the outer surface of a shaft and is positioned opposite excitation and detection coils. A torque acting on the shaft causes material tension in the magnetostrictive layer, wherein its relative magnetic permeability changes as a function of direction. The magnetic field coming from the magnetostrictive layer is measurable with the detection coils.

DE 699 36 138 T2 discloses a magnetic force sensor in which a magnetized material is exposed to a bending moment, wherein the outer magnetic field of the magnetized material can be determined with the help of a sensor arrangement.

DE 600 07 641 T2 discloses a transducer element that is provided for a torque or a force sensor transducer. In this transducer element, magnetization areas are formed in a radially inner region and in a radially outer region.

From DE 603 09 678 T2, a method is known for detecting a torque in a shaft in which magnetic fields with alternating polarity are generated that are measured with a sensor arrangement.

US 2007/0022809 A1 discloses a device for measuring torque in which a layer is formed from a magnetostrictive material in a shaft.

DE 39 40 220 A1 teaches a load sensor for measuring loads due to a torque acting on a shaft. Magnetostrictive elements in two groups are mounted on the shaft in a zig-zag pattern.

From U.S. Pat. No. 5,052,232, a magnetoelastic torque sensor is known in which a machine element is provided with two circumferential magnetostrictive coatings.

From DE 698 38 904 T2, a torque sensor with circular magnetization is known. The magnetization is formed in a ferromagnetic, magnetostrictive material of a shaft and extends in a circular shape about the shaft.

U.S. Pat. No. 7,752,923 B2 discloses a magnetostrictive torque sensor in which a magnetically insulating layer is deposited on a shaft and a magnetostrictive layer is deposited on this insulating layer.

DE 601 05 794 T2 discloses a force-sensitive transducer element with a body made from magnetic material, wherein at least two magnetized areas that extend at an angle to the force transmission direction and that have opposite magnetization polarities are formed in the body.

DE 691 32 101 T2 discloses a magnetic image sensor with a wire that has magnetization in the circumferential direction.

From DE 692 22 588 T2, a ring-shaped magnetized torque sensor is known.

WO 2007/048143 A2 teaches a sensor with a magnetized shaft.

WO 01/27638 A1 discloses an acceleration sensor with a shaft that is magnetized in the circumferential or longitudinal direction.

From WO 2006/053244 A2, a torque sensor is known that comprises a magnetization on a rotating shaft. The magnetization has a circumferential construction.

U.S. Pat. No. 8,191,431 B2 discloses a sensor arrangement with a magnetized shaft.

SUMMARY

The objective of the present invention lies in that, starting from the prior art, the possibilities for measuring forces and/or moments using the inverse magnetostrictive effect are to be expanded.

The specified objective is attained by a machine element according to the invention and by a method according to the invention.

The arrangement according to the invention is used for measuring a force and/or a moment on a machine element extending along an axis. The force or the moment acts on the machine element, wherein this causes mechanical stresses and the machine element is usually slightly deformed. The axis preferably forms a rotational axis of the machine element.

The machine element has a magnetization area extending circumferentially about the axis for a magnetization formed in the machine element. This area is a magnetization area surrounding the axis, wherein the axis itself preferably does not form a part of the magnetization area. The magnetization area has a tangential orientation with respect to a surface of the machine element extending about the axis. The magnetization area preferably has only a tangential orientation with respect to a surface of the machine element extending about the axis. The magnetization area preferably extends along a closed path about the axis, wherein the magnetization area may have short gaps. The magnetization area forms a primary sensor for determining the force or the moment.

The arrangement further comprises at least one first magnetic field sensor and one second magnetic field sensor each of which form a secondary sensor for determining the force or the moment. The primary sensor, i.e., the magnetization area, is used for converting the force to be measured or the moment to be measured into a corresponding magnetic field, while the secondary sensors enable the conversion of this magnetic field into electrical signals. The first magnetic field sensor and the second magnetic field sensor are each formed for individually measuring at least one first directional component and a second directional component of a magnetic field caused by the magnetization and by the force and/or by the moment. The suitability of the at least two magnetic field sensors for individually measuring the at least two directional components of the magnetic field can be formed directly or indirectly. The at least two directional components are each measurable independently from each other. The specified magnetic field occurs due to the inverse magnetostrictive effect. Thus, the measurement possible with the arrangement according to the invention uses the inverse magnetostrictive effect. The first directional component measurable with the first magnetic field sensor and the second directional component measurable with the first magnetic field sensor have different orientations with respect to the axis. Likewise, the first directional component measurable with the second magnetic field sensor and the second directional component measurable with the second magnetic field sensor have different orientations with respect to the axis. Thus, with each of the magnetic field sensors, different vector components of the magnetic field caused by the magnetization and by the force and/or by the moment can be measured individually. The first magnetic field sensor and the second magnetic field sensor are arranged at different circumferential positions about the axis. Thus, the first magnetic field sensor and the second magnetic field sensor have different angles of rotation relative to the axis.

One special advantage of the arrangement according to the invention is provided in that it enables the measurement of different vector components of the force acting on the machine element or the moment acting on the machine element. The arrangement thus enables a multifunctional measurement.

The magnetization area can be permanently or temporarily magnetized. For preferred embodiments of the arrangement according to the invention, the magnetization area is permanently magnetized so that the magnetization is formed by a permanent magnetization. For alternative preferred embodiments of the arrangement according to the invention, this further has a magnet for magnetizing the magnetization area, so that the magnetization of the magnetization area is basically temporary. The magnet can be formed by a permanent magnet or preferably by an electromagnet.

The permanently or temporarily magnetized magnetization area is preferably magnetically neutral outside of the magnetization area in a state of the machine element unloaded by a force or by a moment, so that no technically relevant magnetic field is measurable outside of the magnetization area.

The magnetization area is a part of the volume of the machine element. The magnetization area preferably has a ring-shaped construction, wherein the axis of the machine element also forms a middle axis of the ring shape. In an especially preferred way, the magnetization area has the shape of a hollow cylinder that is coaxial to the axis of the machine element.

The suitability of the magnetic field sensors for measuring different directional components of the magnetic field can be produced in that the magnetic field sensors each comprise two or three magnetic field sensor elements that are each formed for measuring one of the directional components of the magnetic field caused by the magnetization and by the force and/or by the moment. The magnetic field sensor elements do not have to be arranged in a common housing. The magnetic field sensor elements preferably have identical constructions but different orientations.

The at least two directional components measurable with the magnetic field sensors are preferably selected from the following group of directions: a direction parallel to the axis, i.e., an axial direction; a direction radial to the axis, i.e., a radial direction, and a direction tangential to the axis, i.e., a tangential direction.

In one specific embodiment of the arrangement according to the invention, at least one of the magnetic field sensors is formed for the indirect measurement of one of the directional components of the magnetic field. For example, in one ring-shaped magnetization area, the axial directional component of the magnetic field can be measured indirectly such that a radial directional component of the magnetic field is measured directly with an axial distance to the ring-shaped magnetization area.

The first directional component measurable with the first magnetic field sensor and the second directional component measurable with the first magnetic field sensor are arranged preferably perpendicular to each other with respect to the axis, e.g., tangential and radial. The axial direction, the radial direction, and the tangential direction are perpendicular to each other.

The first directional component measurable with the second magnetic field sensor and the second directional component measurable with the second magnetic field sensor are arranged preferably perpendicular to each other. The axial direction, the radial direction, and the tangential direction are perpendicular to each other.

In preferred embodiments of the arrangement according to the invention, the first directional component measurable with the first magnetic field sensor and the first directional component measurable with the second magnetic field sensor have identical orientations. Accordingly, the second directional component measurable with the first magnetic field sensor and the second directional component measurable with the second magnetic field sensor have identical orientations. For example, the first directional component of both magnetic field sensors can be the axial direction, while the second directional component of both magnetic field sensors can be the tangential direction.

In preferred embodiments of the arrangement according to the invention, the at least two magnetic field sensors are each further formed for measuring a third directional component of the magnetic field caused by the magnetization and by the force and/or by the moment. The third directional component measurable with the first magnetic field sensor and the third directional component measurable with the second magnetic field sensor preferably have identical orientations. The three directional components are preferably formed by the axial direction, the radial direction, and the tangential direction with respect to the axis of the machine element. Consequently, the first directional component measurable with the first magnetic field sensor, the second directional component measurable with the first magnetic field sensor, and the third directional component measurable with the first magnetic field sensor are arranged perpendicular to each other. Accordingly, the first directional component measurable with the second magnetic field sensor, the second directional component measurable with the second magnetic field sensor, and the third directional component measurable with the second magnetic field sensor are arranged perpendicular to each other.

In preferred embodiments of the arrangement according to the invention, this further comprises a third magnetic field sensor for the separate measurement of at least a first and a second directional component of the magnetic field caused by the magnetization and by the force and/or by the moment. The preferred constructions described above for the directional components measurable with the first magnetic field sensor and with the second magnetic field sensor apply equally for the third magnetic field sensor. For example, the third magnetic field sensor is preferably also formed for measuring a third directional component of the magnetic field caused by the magnetization and by the force and/or by the moment. The three directional components are preferably likewise formed by the axial direction, the radial direction, and the tangential direction with respect to the axis of the machine element.

In preferred embodiments of the arrangement according to the invention, this further comprises a fourth magnetic field sensor for individually measuring at least a first and a second directional component of the magnetic field caused by the magnetization and by the force and/or by the moment. The preferred constructions described above for the directional components measurable with the first magnetic field sensor, with the second magnetic field sensor, and with the third magnetic field sensor apply in the same way to the fourth magnetic field sensor. For example, the fourth magnetic field sensor is preferably also formed for measuring a third directional component of the magnetic field caused by the magnetization and by the force and/or by the moment. The three directional components are preferably likewise formed by the axial direction, the radial direction, and the tangential direction with respect to the axis of the machine element.

In principle, the arrangement according to the invention can also comprise more than four of the magnetic field sensors.

The first directional component measurable with the magnetic field sensors is preferably formed by the direction parallel to the axis of the machine element, i.e., by the axial direction.

The second directional component measurable with the magnetic field sensors is preferably formed by the direction radial to the axis of the machine element, i.e., by the radial direction.

The third directional component measurable with the magnetic field sensors is preferably formed by the direction tangential to the axis of the machine element, i.e., by the tangential direction.

The at least two magnetic field sensors preferably have an identical distance to the axis of the machine element. In principle, the at least two magnetic field sensors can be arranged outside of the machine element or also inside a hollow space of the machine element, for example, if the machine element is formed by a hollow shaft.

The at least two magnetic field sensors are preferably arranged at the same axial position as the magnetization area distributed about the axis. Thus, the magnetic field sensors have the same axial position as the magnetization area. Here, the at least two magnetic field sensors are preferably arranged distributed about a single point of the axis.

The at least two magnetic field sensors are preferably arranged distributed equally about the axis. If the arrangement according to the invention comprises exactly two of the magnetic field sensors. Consequently, these have an angle of 180° to each other with respect to the axis. If the arrangement according to the invention comprises exactly three of the magnetic field sensors. Consequently, two adjacent sensors of these magnetic field sensors have an angle of 120° to each other with respect to the axis. If the arrangement according to the invention comprises exactly four of the magnetic field sensors, two adjacent sensors of the magnetic field sensors have an angle of 90° to each other with respect to the axis.

In a first especially preferred embodiment of the arrangement according to the invention, this comprises four of the magnetic field sensors, wherein the three directional components measurable with the four magnetic field sensors are formed by the direction parallel to the axis, by the direction radial to the axis, and by the direction tangential to the axis. The adjacent sensors of the four magnetic field sensors each have an angle of 90° to each other with respect to the axis.

In a second especially preferred embodiment of the arrangement according to the invention, this comprises four of the magnetic field sensors, wherein the two directional components measurable with the four magnetic field sensors are formed by the direction parallel to the axis and by the direction tangential to the axis. The adjacent sensors of the four magnetic field sensors each have an angle of 90° to each other with respect to the axis.

In a third especially preferred embodiment of the arrangement according to the invention, this comprises four of the magnetic field sensors, wherein the two directional components measurable with the four magnetic field sensors are formed by the direction parallel to the axis and by the direction radial to the axis. The adjacent sensors of the four magnetic field sensors each have an angle of 90° to each other with respect to the axis.

In a fourth especially preferred embodiment of the arrangement according to the invention, this comprises three of the magnetic field sensors, wherein the three directional components measurable with the three magnetic field sensors are formed by the direction parallel to the axis, by the direction tangential to the axis, and by the direction radial to the axis. The adjacent sensors of the three magnetic field sensors each have an angle of 120° to each other with respect to the axis.

In a fifth especially preferred embodiment of the arrangement according to the invention, this comprises three of the magnetic field sensors, wherein the two directional components measurable with the three magnetic field sensors are formed by the direction parallel to the axis and by the direction tangential to the axis. The adjacent sensors of the three magnetic field sensors each have an angle of 120° to each other with respect to the axis.

In a sixth especially preferred embodiment of the arrangement according to the invention, this comprises three of the magnetic field sensors, wherein the two directional components measurable with the three magnetic field sensors are formed by the direction parallel to the axis and by the direction radial to the axis. The adjacent sensors of the three magnetic field sensors each have an angle of 120° to each other with respect to the axis.

In a seventh especially preferred embodiment of the arrangement according to the invention, this comprises two of the magnetic field sensors, wherein the three directional components measurable with the two magnetic field sensors are formed by the direction parallel to the axis, by the direction tangential to the axis, and by the direction radial to the axis. The two magnetic field sensors have an angle of 180° to each other with respect to the axis.

In one specific embodiment of the arrangement according to the invention, the machine element extends in a first section along the axis, so that the axis is to be viewed as a first axis. In the first section, the machine element has the magnetization area, so that this is to be viewed as a first magnetization area. The machine element also has a second section in which it extends along a second axis arranged perpendicular to the first axis. Consequently, the machine element extends at a right angle. The arrangement according to the invention is formed both in the first section and also in the second section. Here, in the second section, the machine element has a second magnetization area extending circumferentially about the axis for a second magnetization and at least one first magnetic field sensor allocated to the second section and a second magnetic field sensor allocated to the second section. The constructions of the magnetization area described above apply in the same way also to the second magnetization area. The constructions of the magnetic field sensors described above apply in the same way also to the magnetic field sensors allocated to the second magnetization area. In particular, the magnetic field sensors allocated to the second section are each formed for measuring at least a first and a second directional component of a second magnetic field caused by the second magnetization and by the force and/or by the moment. The first directional component measurable with the first magnetic field sensor allocated to the second section and the second directional component measurable with the first magnetic field sensor allocated to the second section have different orientations. Likewise, the first directional component measurable with the second magnetic field sensor allocated to the second section and the second directional component measurable with the second magnetic field sensor allocated to the second section have different orientations. The first magnetic field sensor allocated to the second section and the second magnetic field sensor allocated to the second section are arranged at different circumferential positions about the second axis. This special embodiment enables the measurement of forces and moments in all three spatial directions already with exactly two magnetic field sensors allocated to the first section and exactly two magnetic field sensors allocated to the second section.

The magnetization area preferably exhibits a high magnetostrictive effect.

The magnetization area can also be formed multiple times, so that the machine element of the arrangement according to the invention preferably has multiple magnetization areas. In this way, for example, the interfering influence of external magnetic fields can be compensated. Preferably, the surrounding magnetization areas are arranged one next to the other with axial spacing and differ only in their polarity, i.e., in their rotational sense. Preferably, adjacent magnetization areas each have opposite polarities.

The machine element preferably has the shape of a prism or of a cylinder, wherein the prism or the cylinder is arranged coaxial to the axis. The prism or the cylinder is preferably straight. In an especially preferred way, the machine element has the shape of a straight circular cylinder, wherein the circular cylinder is arranged coaxial to the axis. For special embodiments, the prism or the cylinder has a conical construction. The prism or the cylinder can also be hollow.

The machine element is preferably formed by a shaft, by a hollow shaft, by a shifting fork, or by a flange. The shaft, the shifting fork, or the flange can be designed for loading by different forces and moments. In principle, the machine element can also be formed by completely different types of machine elements.

The at least two magnetic field sensors are preferably each formed by a semiconductor sensor. Such semiconductor sensors directly enable the measurement of multiple directional components of the magnetic field. The at least two magnetic field sensors or the magnetic field sensor elements comprised by the magnetic field sensors are alternatively formed preferably by Hall sensors, coils, saturable reactors, or flux gate magnetometers. In principle, other types of sensors could also be used, if they are suitable for measuring an individual or multiple individual directional components of the magnetic field caused by the inverse magnetostrictive effect.

The method according to the invention is used for measuring a force and/or a moment. The force and/or the moment acts on a machine element extending along an axis. The machine element has a magnetization area extending about the axis for a magnetization extending about the axis. The force or the moment is measured in at least two different circumferential positions about the axis. In these two positions, at least two differently oriented directional components of a magnetic field caused by the magnetization and by the force and/or by the moment are determined.

One particular advantage of the method according to the invention is provided in that it enables the flexible measurement of different directional components of the force and moment that occur.

The method according to the invention is preferably performed on the arrangement according to the invention and its preferred embodiments. Incidentally, the method according to the invention preferably also has those features that are specified in connection with the arrangement according to the invention and its preferred embodiments.

BRIEF DESCRIPTION OF THE DRAWINGS

Additional details, advantages, and refinements of the invention are produced from the following description of preferred embodiments of the invention with reference to the drawing. Shown are.

DETAILED DESCRIPTION OF THE PREFERRED EMBODIMENTS

FIG. 1 to FIG. 7 show the arrangements according to the invention each in two views. The left part of each figure is a cross-sectional view, while the right part of each figure is a top view of the respective embodiment of the arrangement according to the invention.

Figure 1:
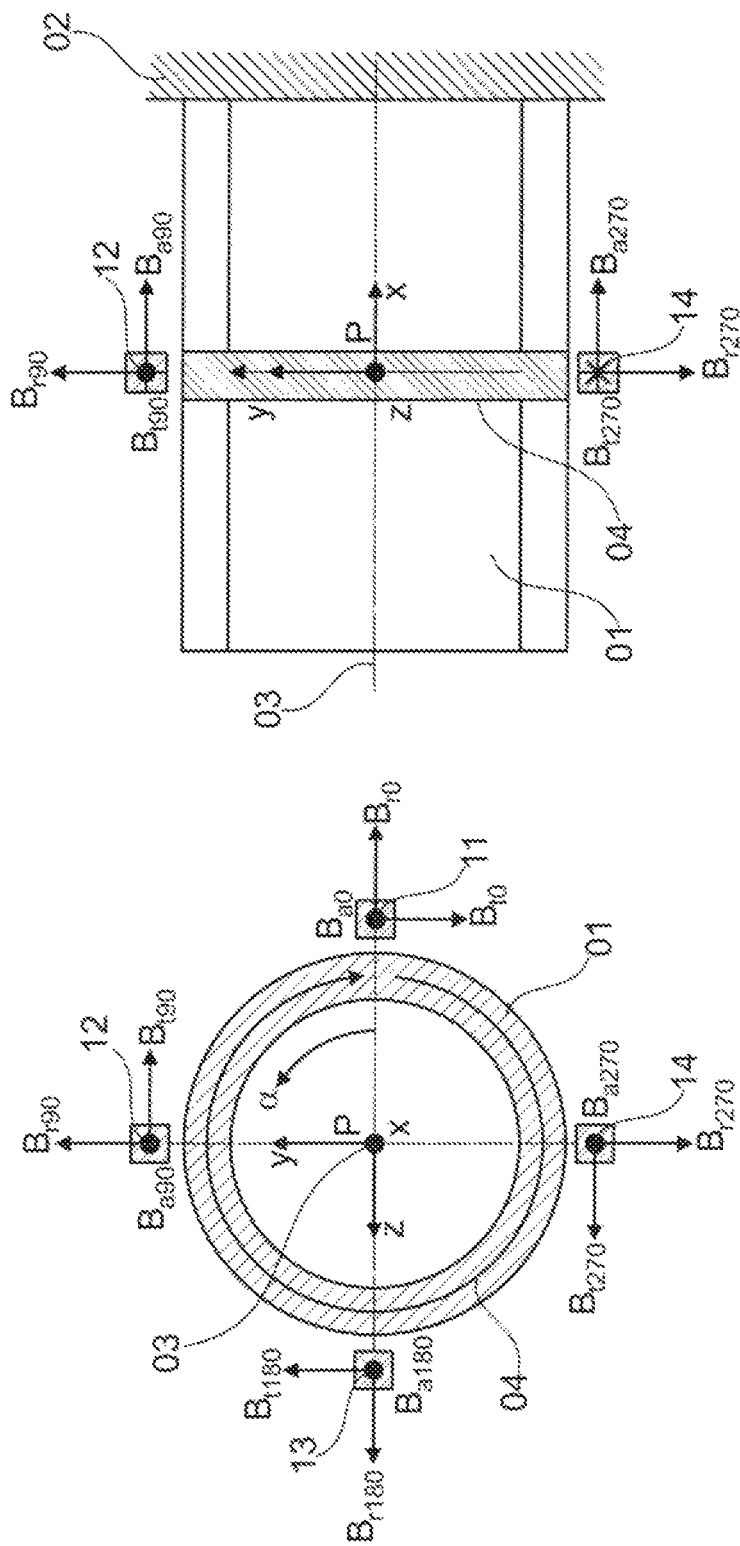
FIG. 1 illustrates a first preferred embodiment of the arrangement according to the invention with four magnetic field sensors.

FIG. 1 shows a first preferred embodiment of the arrangement according to the invention. The arrangement first comprises a machine element in the form of a flange 01 that is mounted on a base body 02. The flange 01 has the shape of a hollow circular cylinder. The flange 01 extends along an axis 03 that also forms the center axis of the hollow cylindrical shape of the flange 01. The flange 01 is formed of a magnetoelastic material that has the magnetostrictive effect.

In an axial section of the flange 01, a permanent magnetization area 04 is formed that extends circumferentially about the axis 03.

Four magnetic field sensors 11, 12, 13, 14 that have an equal distance to the axis 03 and are arranged distributed equally about this axis are arranged circumferentially about the flange 01. The four magnetic field sensors 11, 12, 13, 14 are opposite the permanent magnetization 04. The four magnetic field sensors 11, 12, 13, 14 are each formed by a semiconductor sensor. The four magnetic field sensors 11, 12, 13, 14 are formed to each individually measure three directional components of a magnetic field B. This suitability can alternatively be given such that the magnetic field sensors each comprise three magnetic field sensor elements (not shown) for measuring one of the directional components.

The three Cartesian directions x, y, and z are shown, wherein the axis 03 is in the x direction. Furthermore, for each of the four magnetic field sensors 11, 12, 13, 14, the respective measurable directional components of the magnetic field B are indicated. The indicated directional components have a first suffix, wherein r stands for a radial direction, a for an axial direction, and t for a tangential direction with respect to the axis 03. The indicated directional components have a second suffix that indicates a rotational angle α in degrees. The rotational angle α is spanned between the position of each of the magnetic field sensors 11, 12, 13, 14 and the z-axis. Because the four magnetic field sensors 11, 12, 13, 14 are arranged distributed equally about the axis 03, the rotational angle α=0°, 90°, 180°, or 270°.

With the illustrated embodiment of the arrangement according to the invention, the three directional components Mx, My, and Mz of a moment acting on the flange 01 and the directional components Fy and Fz of a force acting on the flange 01 can be measured. The following relationships apply:

$$M_x = k_1 \cdot (B_{a0} + B_{a90} + B_{a180} + B_{a270}) \text{ or } M_x = k_2 \cdot (B_{a0} + B_{a180}) \text{ or } M_x = k_3 \cdot (B_{a90} + B_{a270})$$

$$M_y = k_4 \cdot (B_{r0} - B_{t180}) \text{ or } M_y = k_5 \cdot (B_{r90} - B_{r270})$$

$$M_z = k_6 \cdot (B_{r0} - B_{r180}) \text{ or } M_z = k_7 \cdot (B_{t90} - B_{t270})$$

$$F_y = k_8 \cdot (B_{a0} - B_{a180})$$

$$F_z = k_9 \cdot (B_{a90} - B_{a270})$$

$k_1, k_2, k_3, k_4, k_5, k_6, k_7, k_8, k_9$: constants

Figure 2:
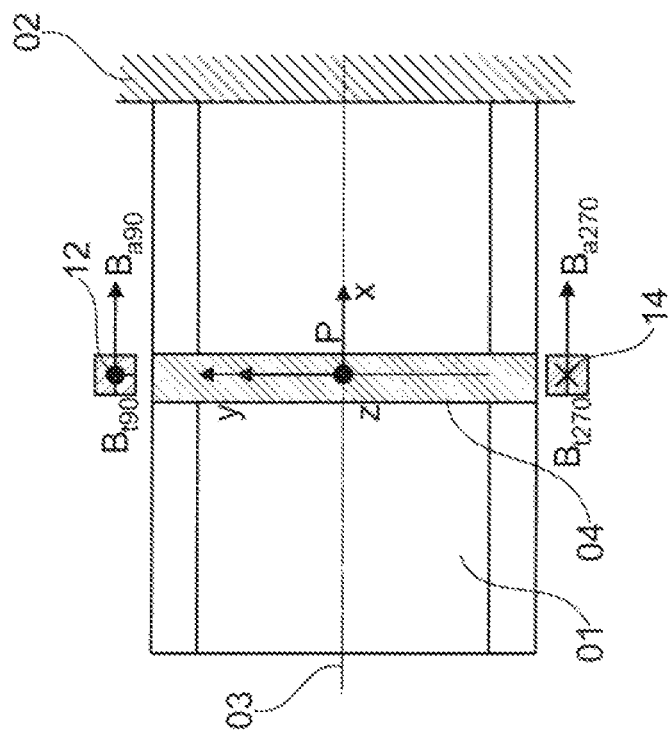
FIG. 2 illustrates a second preferred embodiment of the arrangement according to the invention with four magnetic field sensors.
Figure 2:
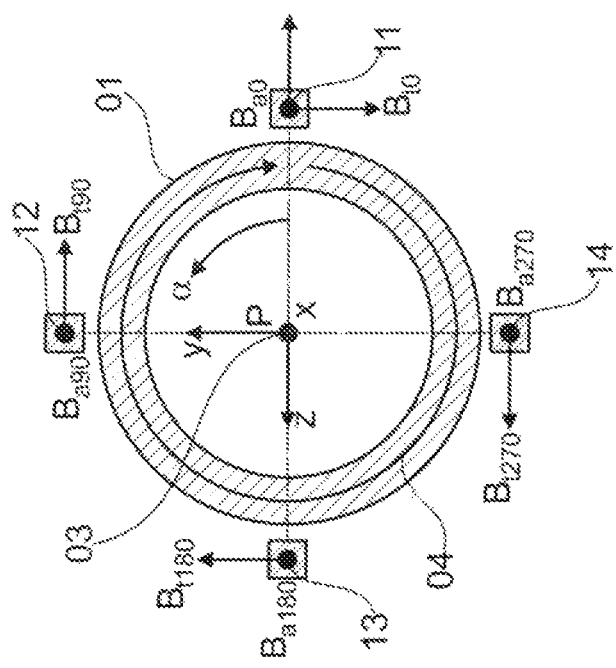

FIG. 2 shows a second preferred embodiment of the arrangement according to the invention. This embodiment is initially equal to the embodiment shown in FIG. 1. Deviating from the embodiment shown in FIG. 1, the four magnetic field sensors 11, 12, 13, 14 are formed to individually measure only two directional components of the magnetic field B, namely in the axial direction and in the tangential direction. This suitability can be alternatively given such that the magnetic field sensors each have two magnetic field sensor elements (not shown) for measuring one of the two directional components.

The following relationships apply:

$$M_x = k_1 \cdot (B_{a0} + B_{a90} + B_{a180} + B_{a270}) \text{ or } M_x = k_2 \cdot (B_{a0} + B_{a180}) \text{ or } M_x = k_3 \cdot (B_{a90} + B_{a270})$$

$$M_y = k_4 \cdot (B_{r0} - B_{t180})$$

$$M_z = k_7 \cdot (B_{t90} - B_{t270})$$

$$F_y = k_8 \cdot (B_{a0} - B_{a180})$$

$$F_z = k_9 \cdot (B_{a90} - B_{a270})$$

$k_1, k_2, k_3, k_4, k_7, k_8, k_9$: constants

Figure 3:
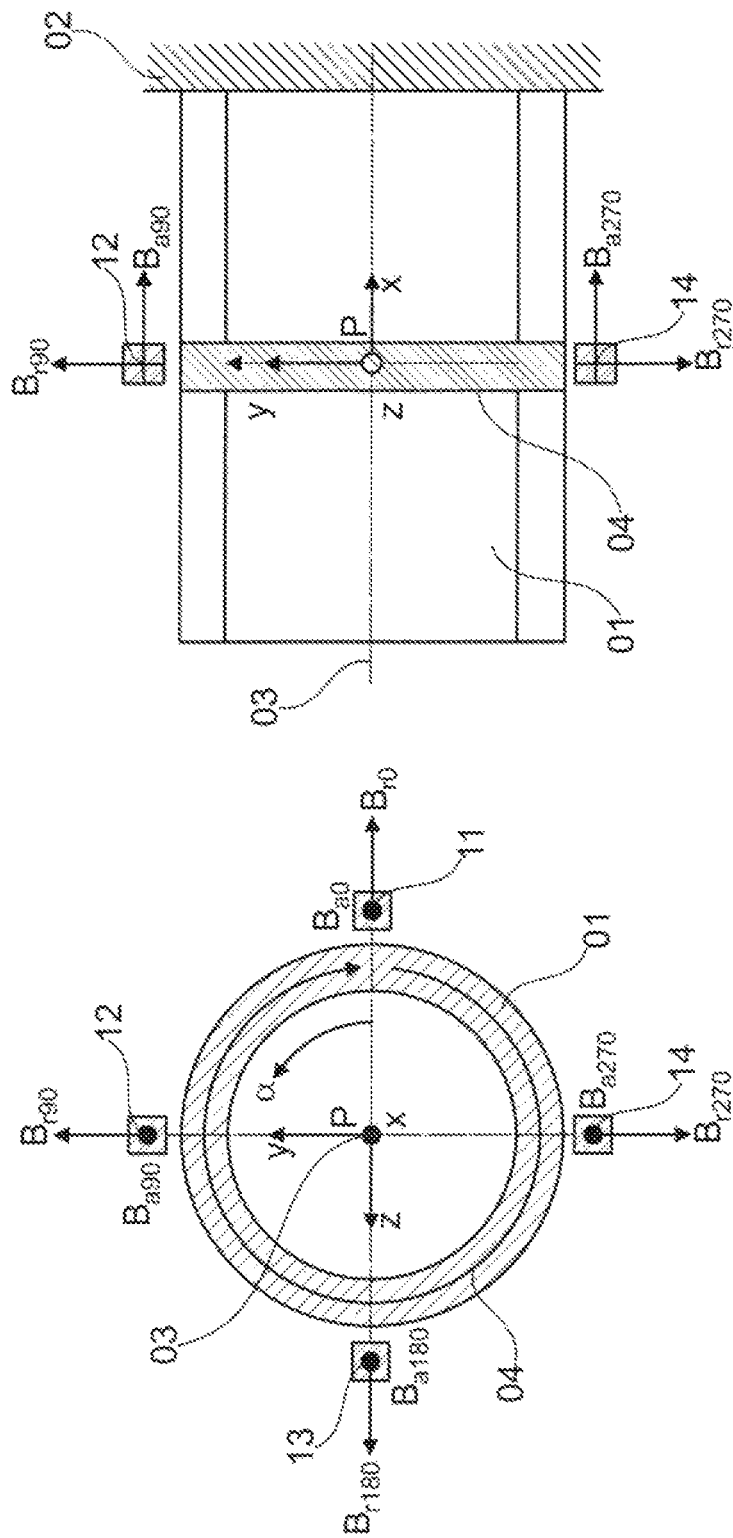
FIG. 3 illustrates a third preferred embodiment of the arrangement according to the invention with four magnetic field sensors.

FIG. 3 shows a third preferred embodiment of the arrangement according to the invention. This embodiment is initially equal to the embodiment shown in FIG. 1. Deviating from the embodiment shown in FIG. 1, the four magnetic field sensors 11, 12, 13, 14 are formed to individually measure only two directional components of the magnetic field B, namely in the axial direction and in the radial direction. This suitability can alternatively be given such that the magnetic field sensors each comprise two magnetic field sensor elements (not shown) for measuring one of the two directional components.

The following relationships apply:

$$M_x = k_1 \cdot (B_{a0} + B_{a90} + B_{a180} + B_{a270}) \text{ or } M_x = k_2 \cdot (B_{a0} + B_{a180}) \text{ or } M_x = k_3 \cdot (B_{a90} + B_{a270})$$

$$M_y = k_5 \cdot (B_{r90} - B_{r270})$$

$$M_z = k_6 \cdot (B_{r0} - B_{r180})$$

$$F_y = k_8 \cdot (B_{a0} - B_{a180})$$

$$F_z = k_9 \cdot (B_{a90} - B_{a270})$$

$k_1, k_2, k_3, k_5, k_6, k_8, k_9$: constants

Figure 4:
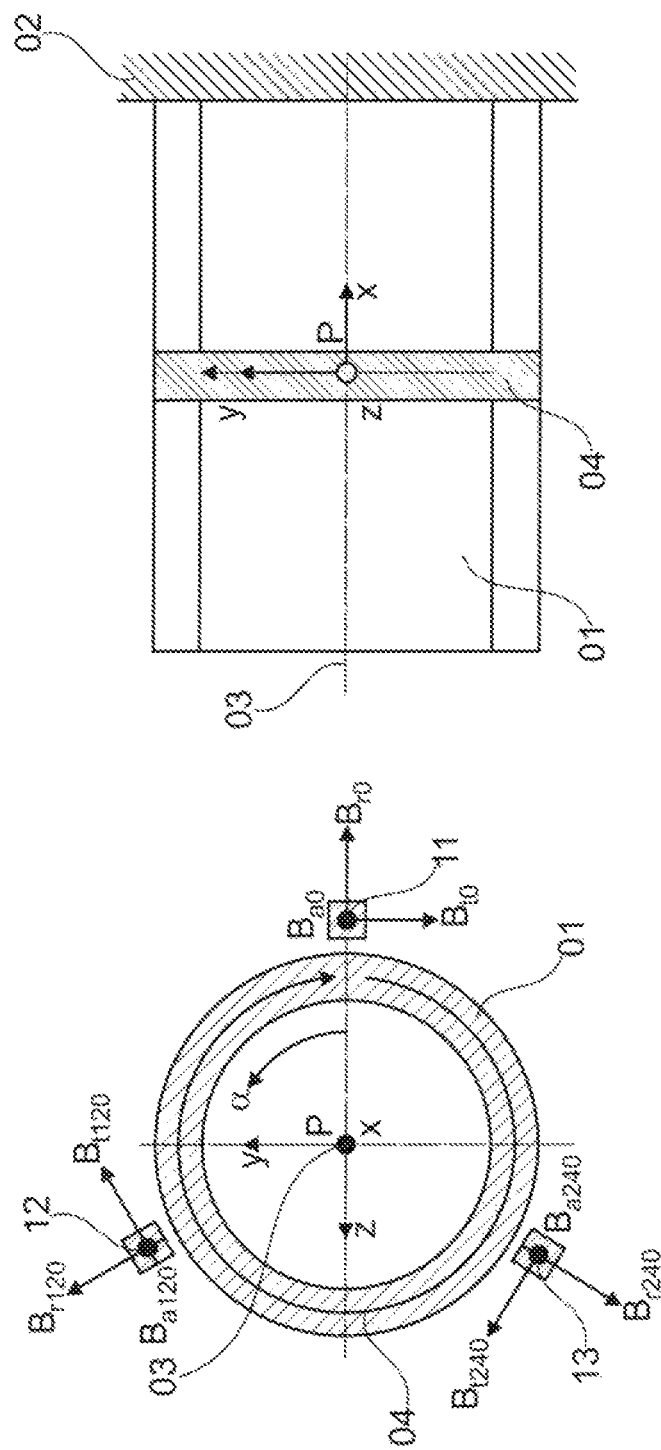
FIG. 4 illustrates a fourth preferred embodiment of the arrangement according to the invention with three magnetic field sensors.

FIG. 4 shows a fourth preferred embodiment of the arrangement according to the invention. This embodiment is initially equal to the embodiment shown in FIG. 1. Deviating from the embodiment shown in FIG. 1, only three of the magnetic field sensors 11, 12, 13 are present. The three magnetic field sensors 11, 12, 13 are distributed equally about the axis 03, so that the rotational angle α=0°, 120°, or 240°.

The following relationships apply:

$$M_x = k_1 \cdot (B_{a0} + B_{a120} + B_{a240})$$

$$M_y = k_4 \cdot (B_{r120} - B_{r240}) \text{ or } M_y = k_5 \cdot (B_{r0} - \tfrac{1}{2} (B_{120} + B_{t240}))$$

$$M_z = k_6 \cdot (B_{t120} - B_{t240}) \text{ or } M_z = k_7 \cdot (B_{r0} - \tfrac{1}{2} (B_{r120} + B_{r240}))$$

$$F_y = k_8 \cdot (B_{a0} - \tfrac{1}{2} (B_{a120} + B_{a240}))$$

$$F_z = k_9 \cdot (B_{a120} - B_{a240})$$

$k_1, k_4, k_5, k_6, k_7, k_8, k_9$: constants

Figure 5:
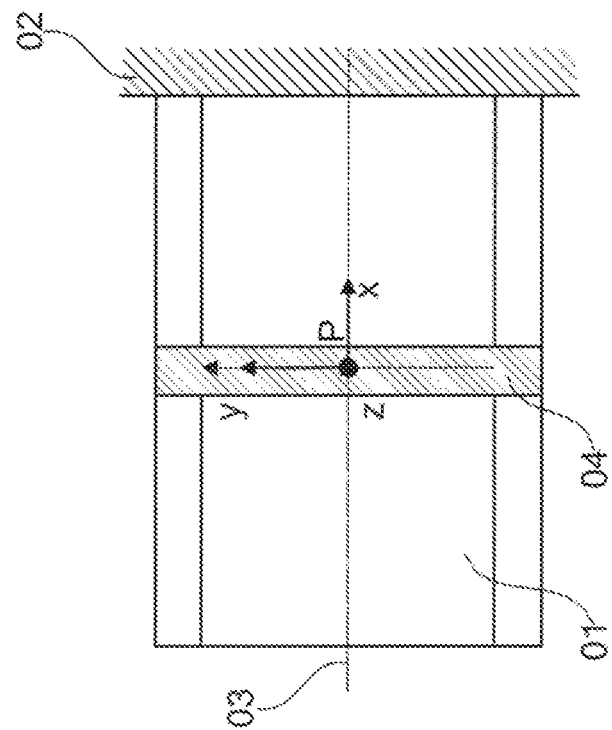
FIG. 5 illustrates a fifth preferred embodiment of the arrangement according to the invention with three magnetic field sensors.
Figure 5:
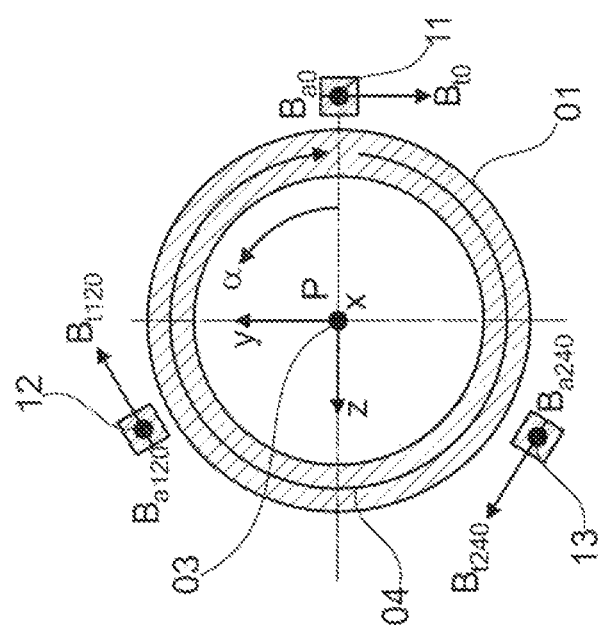

FIG. 5 shows a fifth preferred embodiment of the arrangement according to the invention. This embodiment is initially equal to the embodiment shown in FIG. 4. Deviating from the embodiment shown in FIG. 4, the three magnetic field sensors 11, 12, 13 are formed to individually measure only two directional components of the magnetic field B, namely in the axial direction and in the tangential direction. This suitability can alternatively be given such that the magnetic field sensors each comprise two magnetic field sensor elements (not shown) for measuring one of the two directional components.

The following relationships apply:

$$M_x = k_1 \cdot (B_{a0} + B_{a120} + B_{a240})$$

$$M_y = k_5 \cdot (B_{r0} - \tfrac{1}{2} (B_{t120} + B_{t240}))$$

$$M_z = k_6 \cdot (B_{t120} - B_{t240})$$

$$F_y = k_8 \cdot (B_{a0} - \tfrac{1}{2} \cdot (B_{a120} + B_{a240}))$$

$$F_z = k_9 \cdot (B_{a120} - B_{a240})$$

$k_1, k_5, k_6, k_8, k_9$: constants

Figure 6:
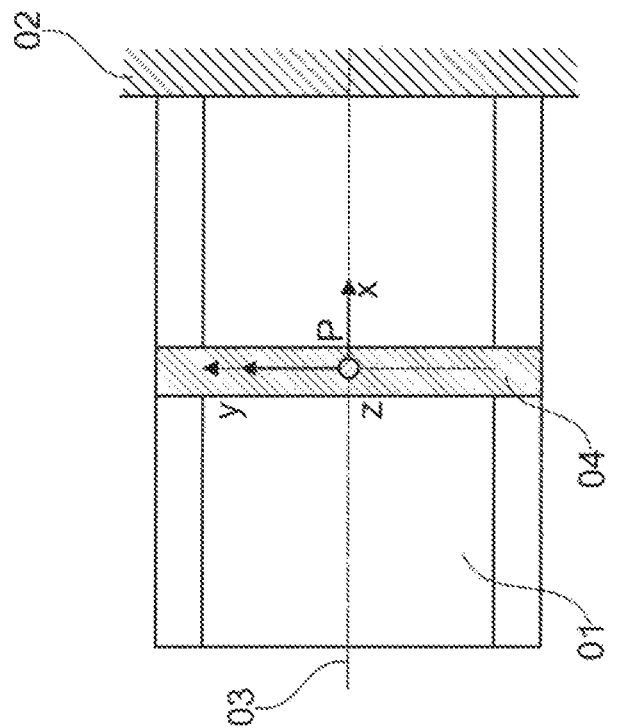
FIG. 6 illustrates a sixth preferred embodiment of the arrangement according to the invention with three magnetic field sensors.
Figure 6:
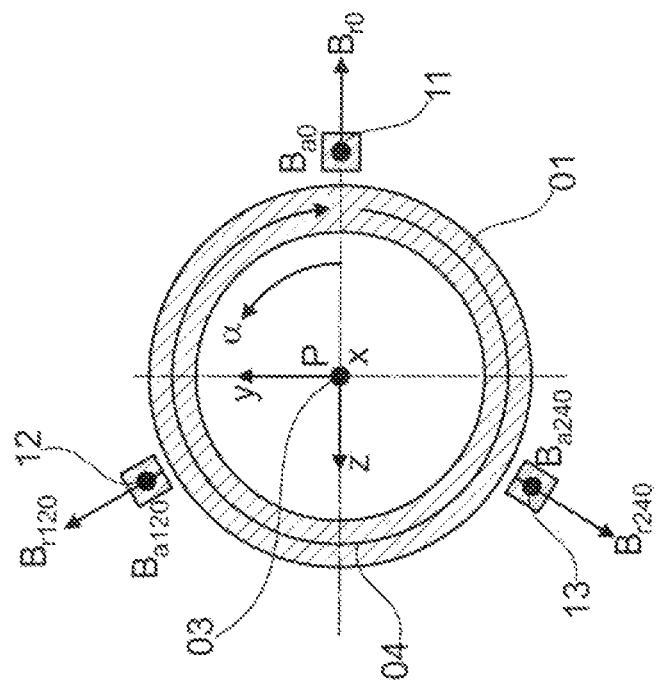

FIG. 6 shows a sixth preferred embodiment of the arrangement according to the invention. This embodiment is initially equal to the embodiment shown in FIG. 4. Deviating from the embodiment shown in FIG. 4, the three magnetic field sensors 11, 12, 13 are formed to individually measure only two directional components of the magnetic field B, namely in the axial direction and in the radial direction. This suitability can alternatively be given such that the magnetic field sensors each comprise two magnetic field sensor elements (not shown) for measuring one of the two directional components.

The following relationships apply:

$$M_x = k_1 \cdot (B_{a0} + B_{a120} + B_{a240})$$

$$M_y = k_4 \cdot (B_{r120} - B_{r240})$$

$$M_z = k_7 \cdot (B_{r0} - \tfrac{1}{2} \cdot (B_{a120} + B_{r240}))$$

$$F_y = k_8 \cdot (B_{a0} - \tfrac{1}{2} \cdot (B_{a120} + B_{a240}))$$

$$F_z = k_9 \cdot (B_{a120} - B_{a240})$$

$k_1, k_4, k_7, k_8, k_9$: constants

Figure 7:
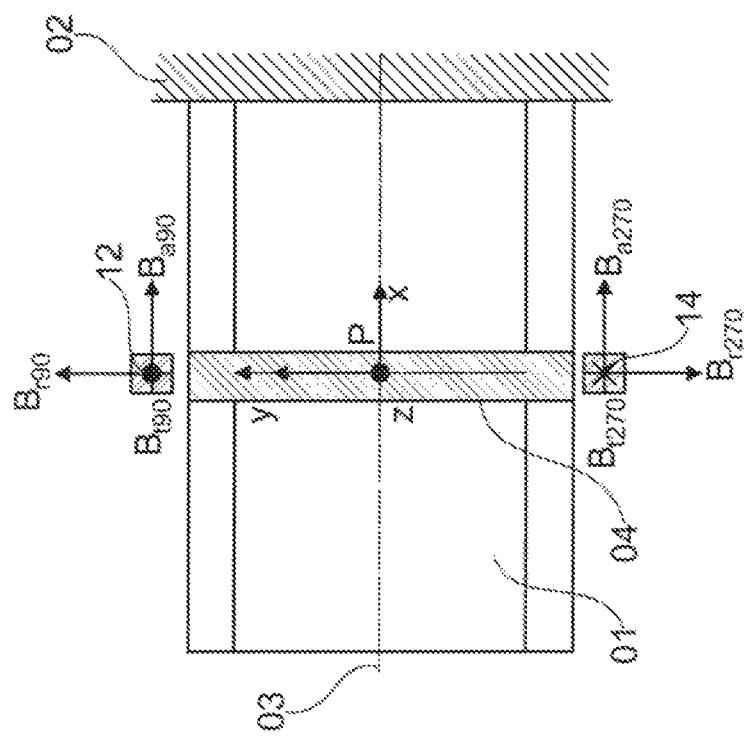
FIG. 7 illustrates a seventh preferred embodiment of the arrangement according to the invention with two magnetic field sensors.
Figure 7:
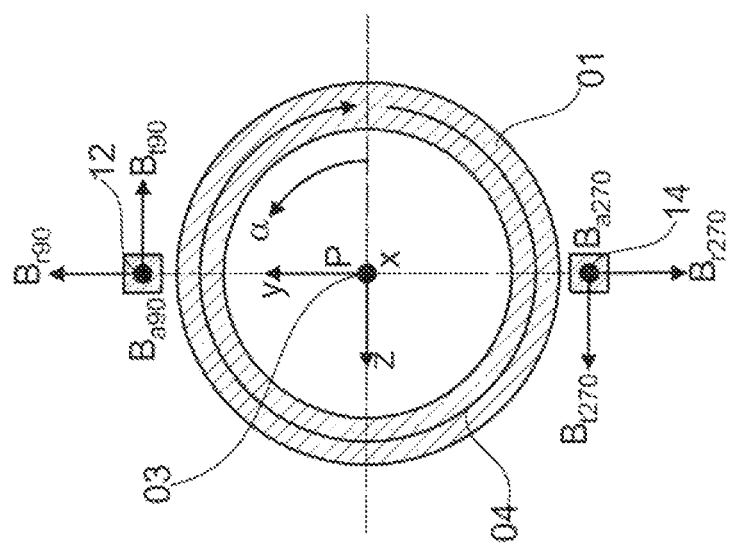

FIG. 7 shows a seventh preferred embodiment of the arrangement according to the invention. This embodiment is initially equal to the embodiment shown in FIG. 1. Deviating from the embodiment shown in FIG. 1, only two of the magnetic field sensors 12, 14 are present. The two magnetic field sensors 12, 14 are distributed equally about the axis 03, so that the rotational angle α=90° or 270°.

The following relationships apply:

$$M_x = k_3 \cdot (B_{a90} + B_{a270})$$

$$M_y = k_5 \cdot (B_{r90} - B_{r270})$$

$$M_z = k_7 \cdot (B_{t90} - B_{t270})$$

$$F_z = k_9 \cdot (B_{a90} - B_{a270})$$

$k_3, k_5, k_7, k_9$: constants

Figure 8:
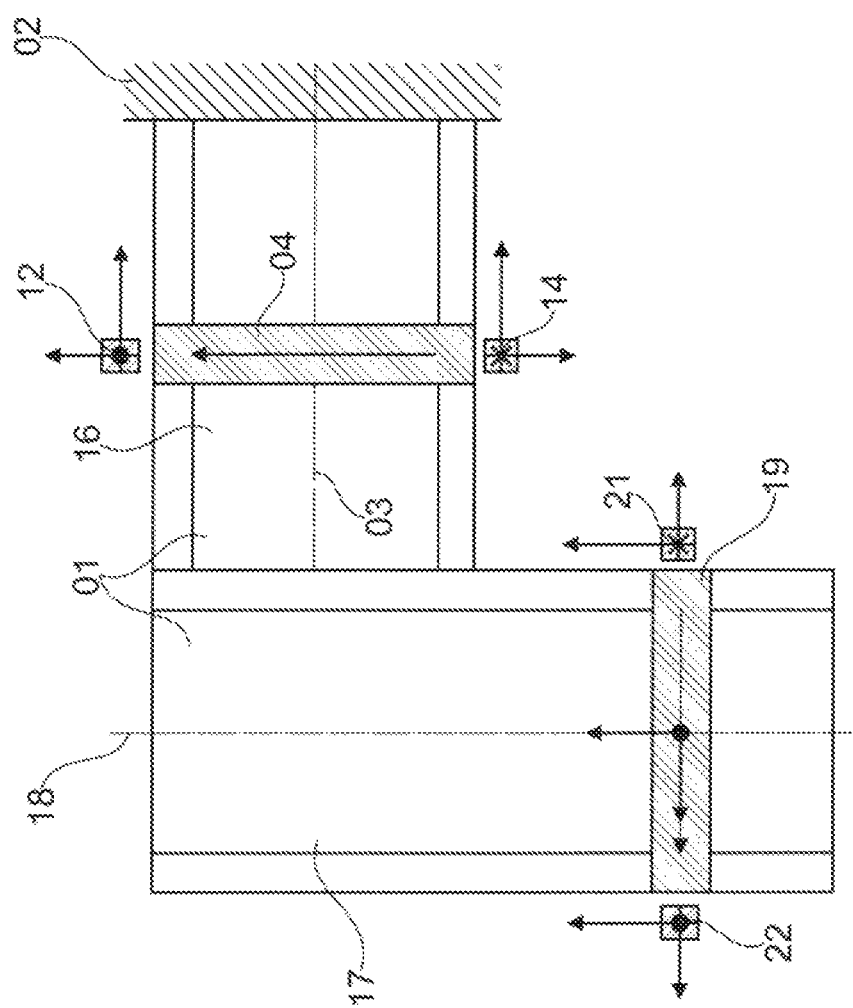
FIG. 8 illustrates an eighth preferred embodiment of the arrangement according to the invention with four magnetic field sensors.

FIG. 8 shows an eighth preferred embodiment of the arrangement according to the invention. This embodiment is initially equal to the embodiment shown in FIG. 1. Deviating from the embodiment shown in FIG. 1, the flange extends only in a first section 16 along the axis 03, so that the axis 03 forms a first axis 03. In a second section 17, the flange 01 extends along a second axis 18 that is perpendicular to the first axis 03.

The flange 01 has, in its second section 17, a second permanent magnetization area 19, so that the permanent magnetization area 04 in the first section 16 forms a first permanent magnetization area. The two magnetic field sensors 12, 14 are allocated to the first permanent magnetization area 04. In the same way, a first magnetic field sensor 21 and a second magnetic field sensor 22 are allocated to the second permanent magnetization area 19.

With the four magnetic field sensors 12, 14, 21, 22, all three directional components Mx, My, and Mz of the moment acting on the flange 01 and all three directional components Fx, Fy, and Fz of the force acting on the flange 01 can be measured. Here, alternatively another of the magnetic field sensor arrangements shown in FIG. 1 to FIG. 7 can also be selected for the two sections 16, 17 of the flange 01. A prerequisite for this is that the force causing the load or the moment causing the load is applied in the second section 17 of the flange 01.

LIST OF REFERENCE NUMBERS

01 Flange
02 Base body
03 Axis
04 Permanent magnetization area
05 -
06 -
07 -
08 -
09 -
10 -
11 First magnetic field sensor
12 Second magnetic field sensor
13 Third magnetic field sensor
14 Fourth magnetic field sensor
15 -
16 First section
17 Second section
18 Second axis
19 Second permanent magnetization area
20 -
21 First magnetic field sensor allocated to the second section
22 Second magnetic field sensor allocated to the second section

The invention claimed is:

1. An arrangement for measuring at least one of a force or a moment on a machine element extending along an axis, in which the machine element includes a magnetization area for a magnetization extending circumferentially around the axis, the magnetization area is permanently magnetized, so that the magnetization is formed by a permanent magnetization,
   the arrangement further comprises at least one first magnetic field sensor and one second magnetic field sensor each of which are formed for individually measuring a first and a second directional component of a magnetic field caused by the magnetization and by the at least one of the force or the moment,
   wherein the first directional component of the magnetic field measurable with the first magnetic field sensor and the second directional component of the magnetic field measurable with the first magnetic field sensor have different orientations,
   wherein the first directional component of the magnetic field measurable with the second magnetic field sensor and the second directional component of the magnetic field measurable with the second magnetic field sensor have different orientations, and
   the first magnetic field sensor and the second magnetic field sensor are arranged at different circumferential positions about the axis.

2. The arrangement according to claim 1, wherein the magnetization area has a ring-shaped construction around the axis.

3. The arrangement according to claim 1, wherein the at least two magnetic field sensors each comprise two or three magnetic field sensor elements that are each formed for measuring one of the directional components of the magnetic field caused by the magnetization and by the at least one of the force or the moment.

4. The arrangement according to claim 1, wherein the directional components measurable with the at least two magnetic field sensors are selected from the group: a direction parallel to the axis, a direction radial to the axis, or a direction tangential to the axis.

5. The arrangement according to claim 1, wherein the at least two magnetic field sensors are each further formed for measuring a third directional component of the magnetic field caused by the magnetization and by the at least one of the force or the moment.

6. The arrangement according to claim 1, wherein the at least two magnetic field sensors have an identical distance to the axis.

7. The arrangement according to claim 1, wherein the at least two magnetic field sensors are arranged distributed equally about the axis.

8. The arrangement according to claim 1, wherein the machine element extends in a first section along the axis, so that the axis forms a first axis, the machine element further comprises a second section in which it extends along a second axis arranged perpendicular to the first axis, the second section has a second magnetization area for a second magnetization extending circumferentially about the second axis, the arrangement further comprises at least one additional first magnetic field sensor allocated to the second section and an additional second magnetic field sensor allocated to the second section each of which are constructed for individually measuring at least a first and a second directional component of a magnetic field caused by the second magnetization and by the at least one of the force or the moment, the first directional component measurable with the additional first magnetic field sensor allocated to the second section and the second directional component measurable with the additional first magnetic field sensor allocated to the second section have different orientations, the first directional component measurable with the additional second magnetic field sensor allocated to the second section and the second directional component measurable with the additional second magnetic field sensor allocated to the second section have different orientations, and the additional first magnetic field sensor allocated to the second section and the additional second magnetic field sensor allocated to the second section are arranged at different circumferential positions about the second axis.

9. A method for measuring at least one of a force or a moment, wherein the force or the moment acts on a machine element that extends along an axis and has a magnetization area extending about the axis for a magnetization extending about the axis, the magnetization area is permanently magnetized, so that the magnetization is formed by a permanent magnetization, the method comprising:
    measuring the at least one of the force or the moment in at least two differential circumferential positions about the axis at each of which at least two directional components with different orientations of a magnetic field caused by the magnetization and by the at least one of the force or the moment are determined.

10. The arrangement according to claim 1, wherein the magnetization area is magnetically neutral outside of the magnetization area in a state of the machine element unloaded by a force or by a moment.

* * * * *